(12) United States Patent
Engelmann et al.

(10) Patent No.: US 10,276,439 B2
(45) Date of Patent: Apr. 30, 2019

(54) RAPID OXIDE ETCH FOR MANUFACTURING THROUGH DIELECTRIC VIA STRUCTURES

(71) Applicant: International Business Machines Corporation, Armonk, NY (US)

(72) Inventors: Sebastian U. Engelmann, White Plains, NY (US); Li-Wen Hung, Mahopac, NY (US); Eric Joseph, White Plains, NY (US); Eugene O'Sullivan, Nyack, NY (US); Jeff Waksman, Washington, DC (US); Cornelia Tsang Yang, Medford, MA (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/611,846

(22) Filed: Jun. 2, 2017

(65) Prior Publication Data

US 2018/0350677 A1    Dec. 6, 2018

(51) Int. Cl.
*H01L 21/768*    (2006.01)
*H01L 21/822*    (2006.01)
*H01L 27/06*    (2006.01)
*H01L 23/48*    (2006.01)
*H01L 23/522*    (2006.01)

(52) U.S. Cl.
CPC .... *H01L 21/76898* (2013.01); *H01L 21/8221* (2013.01); *H01L 23/481* (2013.01); *H01L 23/5227* (2013.01); *H01L 27/0688* (2013.01)

(58) Field of Classification Search
CPC ........... H01L 21/76898; H01L 21/8221; H01L 23/5227; H01L 23/481; H01L 27/0688
See application file for complete search history.

(56) References Cited

U.S. PATENT DOCUMENTS

| | | | |
|---|---|---|---|
| 4,162,185 A | 7/1979 | Coburn et al. | |
| 6,074,959 A | 6/2000 | Wang et al. | |
| 6,207,532 B1 * | 3/2001 | Lin | H01L 21/76232 257/E21.549 |
| 6,602,434 B1 | 8/2003 | Hung et al. | |
| 6,746,961 B2 | 6/2004 | Ni et al. | |
| 7,517,804 B2 | 4/2009 | Kiehlbauch et al. | |
| 8,319,597 B2 * | 11/2012 | Privitera | H01C 7/06 338/22 R |
| 2003/0232504 A1 | 12/2003 | Eppler et al. | |

(Continued)

OTHER PUBLICATIONS

Ryu, H. et al., "A comparative study on a high aspect ratio contact hole etching in UFC-and PFC-containing plasmas", Microelectronics journal, 38(1), pp. 125-129 (2007).

(Continued)

*Primary Examiner* — Kyoung Lee
*Assistant Examiner* — Christina A Sylvia
(74) *Attorney, Agent, or Firm* — Scully, Scott, Murphy & Presser, P.C.; L. Jeffrey Kelly, Esq.

(57) ABSTRACT

After bonding a second substrate to a first substrate through a bonded material layer to provide a bonded structure, through dielectric via (TDV) openings of different depths are concurrently formed in the bonded structure by performing a single anisotropic etch using fluorine-deficient species that are obtained by dissociation of fluorocarbon-containing molecules.

19 Claims, 7 Drawing Sheets

(56) References Cited

U.S. PATENT DOCUMENTS

| | | | |
|---|---|---|---|
| 2004/0035825 A1 | 2/2004 | Nakamura et al. | |
| 2004/0035826 A1 | 2/2004 | Adachi et al. | |
| 2005/0014383 A1 | 1/2005 | Ji et al. | |
| 2007/0178699 A1* | 8/2007 | Schaller | H01L 21/76808 438/689 |
| 2009/0294814 A1* | 12/2009 | Assefa | H01L 25/167 257/292 |
| 2011/0059617 A1 | 3/2011 | Mitchell et al. | |
| 2012/0146193 A1* | 6/2012 | Stuber | H01L 23/36 257/618 |
| 2014/0035935 A1* | 2/2014 | Shenoy | H01L 23/15 345/501 |
| 2015/0118854 A1* | 4/2015 | Engelmann | H01L 21/3065 438/714 |
| 2015/0318263 A1* | 11/2015 | Yu | H01L 23/36 257/774 |
| 2016/0049504 A1* | 2/2016 | Renaldo | H01L 29/7783 257/20 |
| 2017/0365504 A1* | 12/2017 | Choi | H01L 21/7682 |

OTHER PUBLICATIONS

Karecki, S. et al., "Characterization of iodoheptafluoropropane as a dielectric etchant. I. Process performance evaluation", Journal of Vacuum Science & Technology B, 19(4), pp. 1269-1292 (2001).

Chatterjee, R. et al., "The evaluation of hexafluorobenzene as an environmentally benign dielectric etch chemistry", Journal of The Electrochemical Society, 148(12), G721-G724 (2001).

Ikegami, N. et al., "Characteristics of very high-aspect-ratio contact hole etching", Japanese journal of applied physics, 36(4S), pp. 2470-2476 (1997).

Murthy, B. et al., "A method for deep etching in dielectric films for 3D-chip and photonics applications", Microelectronics journal, 35(11), pp. 909-913 (2004).

Ujiie, T. et al., "Fabrication of quartz microcapillary electrophoresis chips using plasma etching", Japanese Journal of Applied Physics, 39(6R), pp. 3677-3682 (2000).

Nagai, M. et al., "Low-k SiOCH Film Etching Process and Its Diagnostics Employing Ar/C5F10O/N2 Plasma", Japanese Journal of Applied Physics, vol. 45, Part 1, No. 9A, pp. 7100-7104 (2006).

* cited by examiner

RAPID OXIDE ETCH FOR MANUFACTURING THROUGH DIELECTRIC VIA STRUCTURES

BACKGROUND

The present application relates generally to integrated circuit fabrication, more particularly, to the fabrication of through dielectric via (TDV) structures of different depths in a bonded structure using a single anisotropic etch process.

Three-dimensional (3D) integration of two substrates, can produce a number of benefits to microelectronic applications. For example, 3D integration of microelectronic components can result in improved electrical performance and power consumption while reducing the area of the device footprint.

Through dielectric via (TDV) structures provide electrical connection across the multiple substrates in a bonded structure, thus are essential elements for 3D integration. TDV structures are commonly formed after multiple substrates are bonded. The process used for creating TDV structures must etch through multiple back-end-of-line (BEOL) dielectrics. Typically, more than 5 μm-thick dielectrics need to be etched. In conventional etching processes, the BEOL dielectrics are etched using a plasma of fluorocarbon gases, including for example, $CHF_3$, $CH_3F$, $CF_4$, and $CH_2F_2$. However, such conventional gas compositions do not provide sufficient etching rates and etching selectivity that allows etching BEOL dielectrics to form TDVs of different depths in a single etching process, without adversely affecting the integrity of the metal used in the interconnect structures.

Therefore, a method for concurrently forming TDV of different depths, without the need for multiple design masks and/or application of multiple photoresist layers, and with no, or minimal, erosion of interconnect structures remains needed.

SUMMARY

The present application provides an etching chemistry for forming TDV structures of different depths in a single anisotropic etch process, without the need for multiple design masks and/or application of multiple photoresist layers.

According to an aspect of the present application, a method of forming a structure is provided. The method includes first forming a bonded structure including a first substrate and a second substrate bonded to each other through a boned material layer. The first substrate includes a stack of a first semiconductor substrate and a first wiring structure having at least one first dielectric material layer and at least one first interconnect structure embedded therein, and the second substrate includes a second semiconductor substrate and a second wiring structure having at least one second dielectric material layer and at least one second interconnect structure embedded therein. The first substrate is bonded to the second substrate such that the at least one first dielectric material layer faces and underlies the at least one second dielectric material layer. Next, a first TDV opening and a second TDV opening are concurrently formed. The first TDV opening extends through the second semiconductor substrate and the at least one second dielectric material layer to expose a last level second conductive line structure in the at least one second interconnect structure, and the second TDV opening extends through the second semiconductor substrate, the at least one second dielectric material layer and the bonded material layer to expose a last level first conductor line structure in the at least one first interconnect structure. Next, a first TDV structure is formed in the first TDV opening and a second TDV structure is formed in the second TDV opening.

According to yet another aspect of the present application, an integrated inductor is provided. The inductor includes a bonded structure including a first substrate and a second substrate bonded to each other through a boned material layer. The first substrate includes a stack of a first semiconductor substrate and a first wiring structure having at least one first dielectric material layer and at least one first interconnect structure embedded therein, and the second substrate includes a second semiconductor substrate and a second wiring structure having at least one second dielectric material layer and at least one second interconnect structure embedded therein. The first substrate is bonded to the second substrate such that the at least one first dielectric material layer faces and underlies the at least one second dielectric material layer. The inductor further includes a first TDV structure extending through the second semiconductor substrate and the at least one second dielectric material layer and contacting a last level second conductive line in the at least one second interconnect structure, and a second TDV structure extending through the second semiconductor substrate, the at least one second dielectric material layer and the bonded material layer and contacting a last level first conductive line in the at least one first interconnect structure. The second TDV structure has a greater depth than the first TDV structure. A third conductive line structure is embedded in at least one third dielectric material layer located over a backside surface of the second semiconductor structure and contacts top surfaces of the first TDV structure and the second TDV structure

DETAILED DESCRIPTION

Figure 1A:
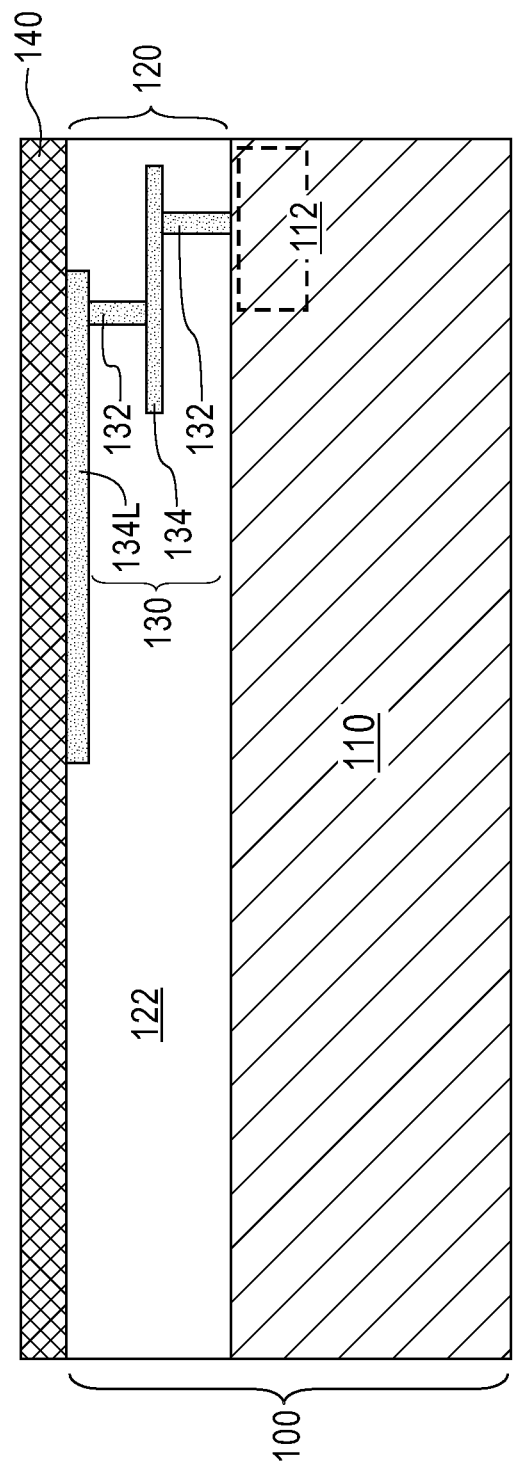
FIG. 1A is a vertical cross-sectional view of an exemplary structure including a first substrate according to an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Figure 1B:
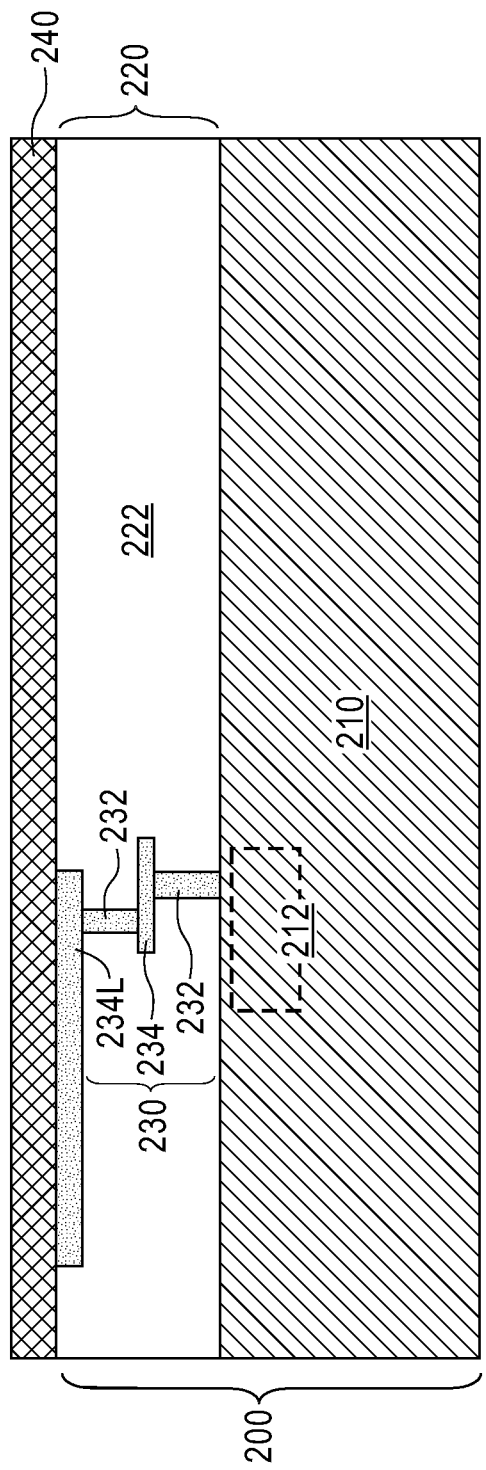
FIG. 1B is a vertical cross-sectional view of an exemplary structure including a second substrate according to an embodiment of the present application.

Referring to FIGS. 1A and 1B, there are illustrated exemplary structures according to an embodiment of the present application. FIG. 1A includes a first substrate 100, while FIG. 1B includes a second substrate 200. The first substrate 100 shown in FIG. 1A can include a vertical stack of, from bottom to top, a first semiconductor substrate 110 and a first BEOL wiring structure 120. The second substrate 200 shown in FIG. 1B can include a vertical stack of, from bottom to top, a second semiconductor substrate 210 and a second BEOL wiring structure 220.

The first semiconductor substrate 110 includes at least one first semiconductor device 112. Likewise, the second semiconductor substrate 210 includes at least one second semiconductor device 212. Each of the at least one first semiconductor device 112 and the at least one second semiconductor device 212 can be, but is not limited to, a field effect transistor, a bipolar transistor, a diode, a resistor, a capacitor, and any other type of semiconductor devices known in the art. A buried insulator layer (not shown) and/or a handle substrate (not shown) can be present within the first semiconductor substrate 110 and/or the second semiconductor substrate 210.

Each of the first semiconductor substrate 110 and the second semiconductor substrate 210 can include a semiconductor material. The semiconductor material may be selected from, but is not limited to, silicon, germanium, silicon-germanium alloy, silicon carbon alloy, silicon-germanium-carbon alloy, gallium arsenide, indium arsenide, indium phosphide, and any other III-V or II-VI compound semiconductor materials. In one embodiment, each of the first semiconductor substrate 110 and the second semiconductor substrate 210 is comprised of single crystalline silicon.

The first BEOL wiring structure 120 includes at least one first dielectric material layer 122 and at least one first interconnect structure 130 embedded therein. Likewise, the second BEOL wiring structure 220 includes at least one second dielectric material layer 222 and at least one second interconnect structure 230 embedded therein. The at least one first interconnect structure 130 provides electrical connection to the at least one first semiconductor device 112. The at least one second interconnect structure 230 provides electrical connection to the at least one second semiconductor device 212.

Each of the at least one first dielectric material layer 122 and the at least one second dielectric material layer 222 includes at least one dielectric material, which can be a doped or undoped silicate glass, silicon nitride, or a low dielectric constant (low-k) material such as organosilicate glass. Each of the at least one first dielectric material layer 122 and the at least one second dielectric material layer 222 can include a plurality of dielectric material layers having different compositions. The composition of the at least one first dielectric material layer 122 and the at least one second dielectric material layer 222 can include any dielectric material known in semiconductor processing technology and can be adjusted as needed. In one embodiment, a total thickness of each of the at least one first dielectric material layer 122 and the at least one second dielectric layer 222 may be from 5 µm to 10 µm, although lesser and greater thicknesses can also be employed.

The at least one first interconnect structure 130 can include first conductive via structures 132 and first conductive line structures 134. As shown, the last level first conductive line structure, denoted as 134L, has a top surface coplanar with a topmost surface of the at least one first dielectric material layer 122. Likewise, the at least one second interconnect structure 230 can include second conductive via structures 232 and second conductive line structures 234. As shown, the last level second conductive line structure, denoted as 234L, has a top surface coplanar with a topmost surface of the at least one second dielectric material layer 222. The at least one first interconnect structure 130 and the at least one second interconnect structure 230 can be formed by dual damascene process known in the art. Each of the at least one first interconnect structure 130 and the at least one second interconnect structure 230 may be composed a conductive material such as, for example, copper, aluminum, tungsten, silver, gold, or platinum. Alloys, such as copper-aluminum, can also be used.

A first bonding material layer 140 is deposited on a topmost surface of the first substrate 100 (i.e., topmost surfaces of the at least one first dielectric material layer 122 and the at least one first interconnect structure 130). A second bonding material layer 240 is deposited on a topmost surface of the second substrate 200 (i.e., topmost surfaces of the at least one second dielectric material layer 222 and the at least one second interconnect structure 230). Each of the first bonding material layer 140 and the second bonding material layer 240 can include a dielectric oxide such as, for example, silicon oxide to facilitate the bonding of the first substrate 100 and the second substrate 200. The first bonding material layer 140 and the second bonding material layer 240 can be formed, for example, by physical vapor deposition (PVD) or chemical vapor deposition (CVD). Although the present application describes and illustrated two separate bonding material layers, a single bonding material layer can be used and formed on one of the substrates 100, 200.

Figure 2:
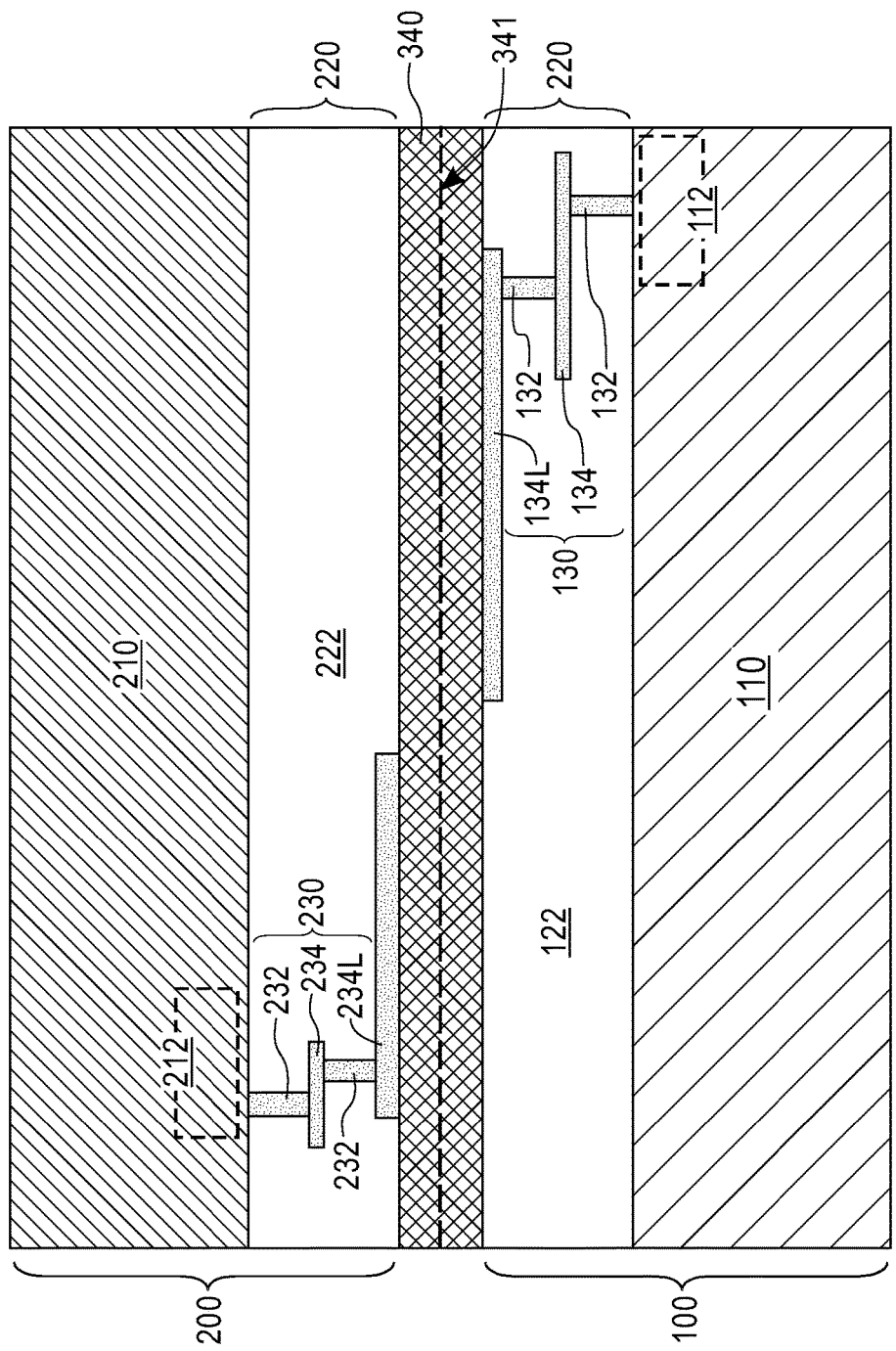
FIG. 2 is a vertical cross-sectional view of the exemplary structures of FIGS. 1A-1B after bonding the first substrate and the second substrate through a bonded material layer to form a bonded structure.

Referring to FIG. 2, the second substrate 200 shown in FIG. 1B is flipped upside down and brought into physical contact with the first substrate 100 shown in FIG. 1A such that a surface of the first bonding material layer 140 contacts a surface of the second bonding material layer 240. The flipping may also be reversed, i.e., the first substrate 100 is flipped and brought into contact with the second substrate 200. Subsequently, an oxide-to-oxide bonding is induced between the first and second bonding material layers 140, 240. The oxide-to-oxide bonding can be effected by an anneal, with or without compression of the first and the second substrates 100, 200, at an elevated temperature, which can be in a range from 200° C. to 500° C., although lesser and greater temperatures can also be employed.

In the illustrated embodiment, a bonded structure including the first substrate 100 and the second substrate 200 that are bonded to each other by a bonded material layer 340 is thus formed. The bonded material layer 340 includes the first bonding material layer 140 (not separately shown) located below a bonding interface 341 and the second bonding material layer 240 (not separately shown) located above the bonding interface 341. The first bonding material layer 140 and the second bonding material layer 240 are of integral construction and collectively constitute the bonded material layer 340. It is understood that the bonding interface 341 is shown only for the demonstrative purpose of marking the original location at which the first and second bonding material layers 140, 240 contact each other. Further, it is understood that the bonding interface 341 may not be physically discernable once the bonded material layer 340 is formed.

Figure 3:
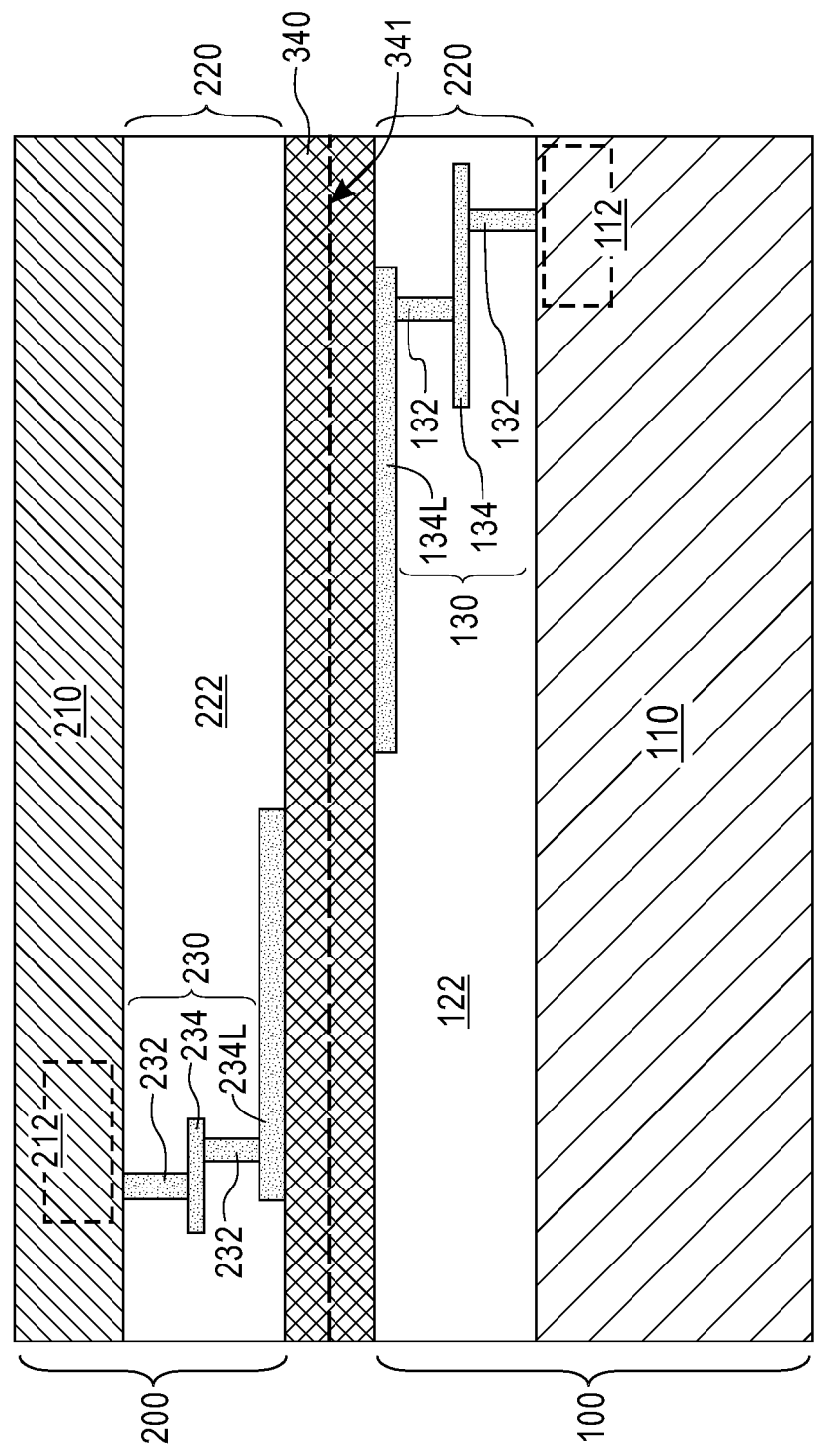
FIG. 3 is a vertical cross-sectional view of the exemplary structure of FIG. 2 after thinning a backside of a second semiconductor substrate in the second substrate that is distal from the bonded material layer.

Referring to FIG. 3, a backside portion of the second substrate 200, i.e., a portion on the backside of the second semiconductor substrate 210 that is distal from the bonding interface 341, can be removed to thin the second semiconductor substrate 210 to a desired target thickness. Specifically, the backside portion of the second semiconductor substrate 210 can be removed, for example, by grinding, cleaving, polishing, etching, or a combination thereof. In one embodiment, the second semiconductor substrate 210 can be thinned to a thickness in a range from 5 μm to 30 μm, although lesser and greater thicknesses can also be employed.

Figure 4:
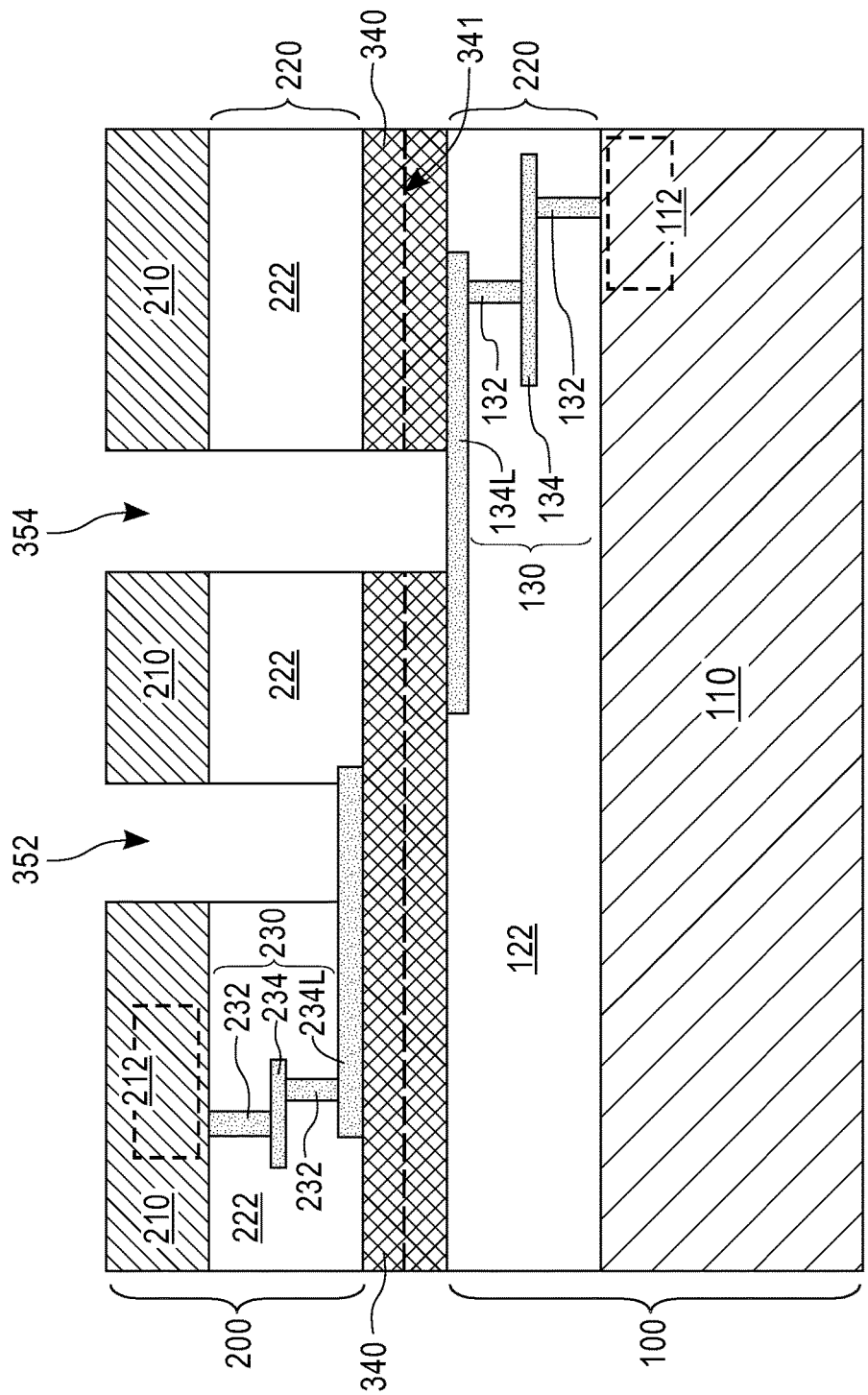
FIG. 4 is a vertical cross-sectional view of the exemplary structure of FIG. 3 after concurrently forming a first TDV opening and a second TDV opening that extends to a greater depth than the first TDV opening in the bonded structure.

Referring to FIG. 4, a first TDV opening 352 and a second TDV opening 354 are formed by a single anisotropic etch. The first TDV opening 352 extends through the second semiconductor substrate 210 and the at least one second dielectric material layer 222, exposing a surface of the last level second conductive line structure 234L in the at least one second interconnect structure 230. The second TDV opening 354 extends through the second semiconductor substrate 210, the at least one second dielectric layer 222 and the bonded material layer 340, exposing a surface of the last level first conductive line structure 134L in the at least one first interconnect structure 130. The second TDV opening 354 is thus extends to a greater depth than the first TDV opening 352.

The first and second TDV openings 352, 354 can be formed by first applying a photoresist layer (not shown) on the backside surface of the second semiconductor substrate 210. The photoresist layer is then lithographically patterned to form a first opening (not shown) over a region including the last level second conductive line structure 234L and a second opening (not shown) over a region including the last level first conductive line structure 134L.

Subsequently, the second semiconductor substrate 210, the at least one second dielectric material layer 222 and the bonded material layer 340 are sequentially etched by a single anisotropic etch that employs the patterned photoresist layer as an etch mask. After exposing the surface of the last level first conductive line structure 234L by the first TDV opening 352, the anisotropic etch continues until the surface of the last level first conductive line 134L is exposed by the second TDV opening 354. After the anisotropic etch, the patterned photoresist layer can be removed, for example, by ashing.

In the present application, the second semiconductor substrate 201, the at least one second dielectric material layer 222 and the bonded material layer 320 can be anisotropically etched utilizing an etching gas containing fluorocarbon-containing molecules represented by a formula of $C_xF_yM$, wherein M is chlorine, bromine, sulfur, oxygen, or nitrogen, and wherein x is from 2 to 5 and y is form 4 to 10. In one embodiment the fluorocarbon-containing molecule is $C_5F_{10}O$. Due to the weak bonding energy of the M species in the $C_xF_yM$ molecules, the $C_xF_yM$ molecules easily dissociate into fluorine-deficient fluorocarbon species such as, for example, $CF_2$, $CF$, or $C_{x'}F_{y'}M$, wherein x' is from 1 to 5, y' is from 1 to 8. Other fluorine-deficient fluorocarbon species including, but not limited to, $CHF_3$, $C_4F_8$ and $C_5HF_7$ can also be used as the etching gas in the present application. The fluorine-deficient fluorocarbon species provide a rapid dielectric etching rate, while maintaining a proper etching selectivity between the dielectric materials that provide the at least one second dielectric material layer 222 and the bonded material layer 340 and the conductive materials that provide the at least one first interconnect structure 130 and the at least second interconnect structure 230. In one embodiment, the second semiconductor substrate 210, the at least one second dielectric material layer 222 and the bonded material layer 324 can be etched at a rate of 15 nm/s with an etching gas containing $C_5F_{10}O$ and $C_5HF_7$. This etching rate is about 10% faster than the conventional etching gas employing saturated fluorocarbon $CF_4$ under the same etching conditions. The rapid dielectric etching rate and the proper etching selectivity of the fluorine-deficient fluorocarbon species ensure that the TDV openings of different depths can be formed concurrently, while the conductive materials (e.g., copper, tungsten) that provide interconnect structures 130, 230 are not adversely affected. The fluorine-deficient species also protect sidewalls of the TDV openings 352, 354 during the anisotropic etch to against undesirable lateral etching.

In the present application, by employing fluorine-deficient fluorocarbon species that are obtained by dissociation of $C_xF_yM$ molecules as an etchant in dielectric anisotropic etch, TDV openings of different depths (e.g., the first via opening 352, the second trench 354) can be formed in a same fabrication step, without the need for multiple design masks and/or application of multiple photoresist layers. Such a single step formation of the TDV openings of different depths helps to reduce the fabrication cost. The rapid etching rate of the fluorine-deficient fluorocarbon species also allows a more economic resist budget.

Figure 5:
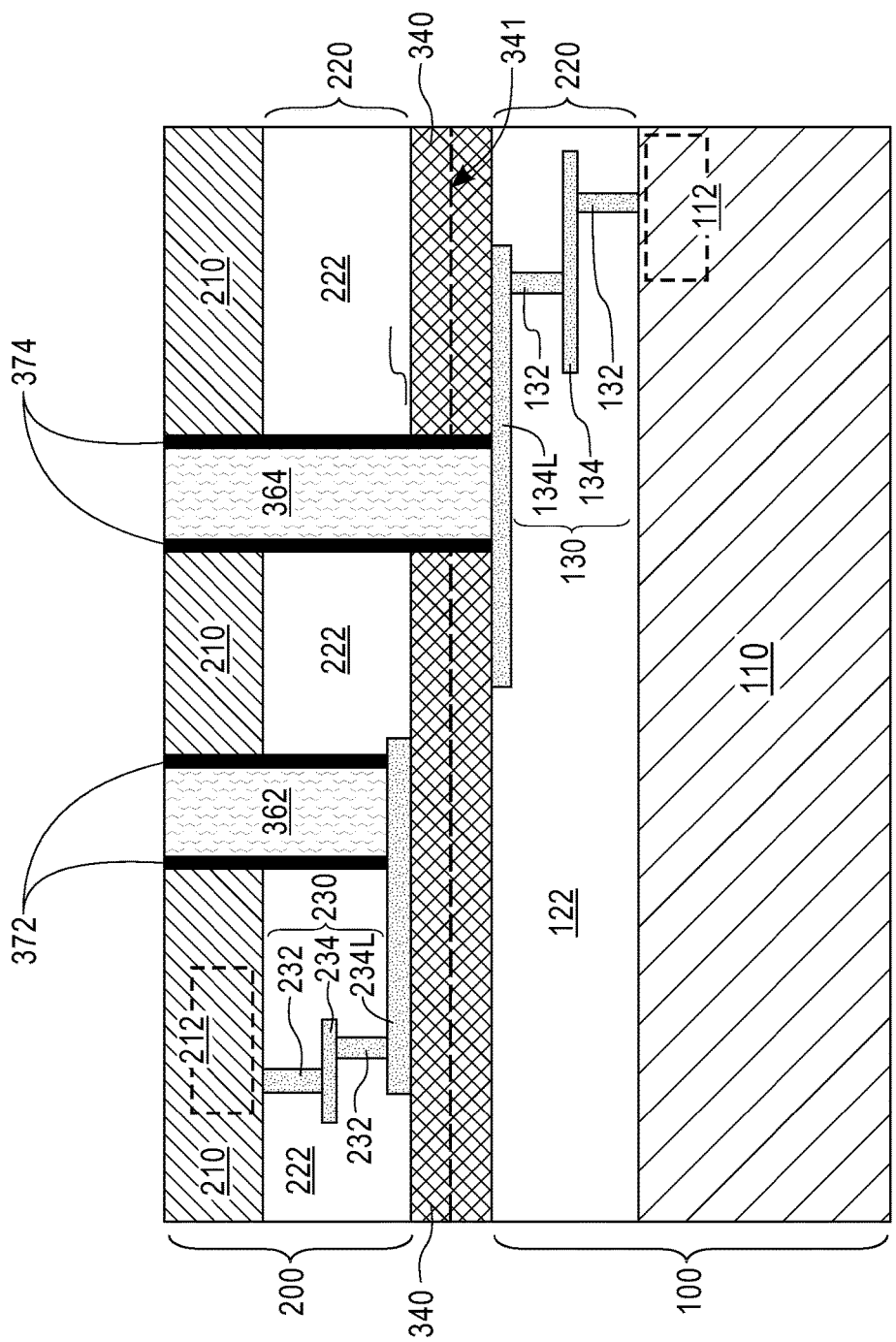
FIG. 5 is a vertical cross-sectional view of the exemplary structure of FIG. 4 after forming a first TDV structure within the first TDV opening and a second TDV structure within the second TDV opening.

Referring to FIG. 5, a first TDV structure 362 is formed within the first TDV opening 352 and a second TDV structure 364 is formed within the second TDV opening 354. The first TDV structure 362 and the second TDV structure 364 can be formed, for example, by filing the first TDV opening 352 and the second TDV opening 354 with a conductive material. The conductive material can include, for example, copper, aluminum, tungsten, silver, gold, platinum, although other metallic elements and/or alloys thereof can also be employed. The conductive material can be deposited, for example, by PVD, CVD, electroplating, electroless plating, or combinations thereof. Optionally, metal barriers including a metallic material such as Ta, Ti, W, TaN, TiN, WN, TaC, TiC, WC may be used before depositing the conductive material.

Excess portions of the conductive material above the backside surface of the second semiconductor substrate 210 can be subsequently removed, for example, by a recess etch, chemical mechanical planarization (CMP), or a combination thereof. A remaining portion of the conductive material within the first TDV opening 352 constitutes the first TDV structure 362. The first TDV structure 362 extends through the second semiconductor substrate 201 and the at least one second dielectric material layer 222 and contacts the last level second conductive line structure 234L in the at least one second interconnect structure 230. A remaining portion of the conductive material within the second TDV opening constitutes the second TDV structure 364. The second TDV structure 364 extends through the second semiconductor substrate 201, the at least one second dielectric material layer 222 and the bonded material layer 340 and contacts the last level first conductive line structure 134L in the at least one first interconnect structure 130. In one embodiment, after the planarization process, the top surfaces of the first and second TDV structures 362, 364 can be coplanar with the backside surface of the second semiconductor substrate 201.

In some embodiments of the present application, before the filling of the first and second TDV openings 352, 354 with the conductive material, a first dielectric liner 372 can be formed on sidewalls of the first TDV opening 352 to provide electrical isolation of the first TDV structure 362 from elements other than the at least one second interconnect structure 230, and a second dielectric liner 374 can be formed on sidewalls of the second TDV opening 354 to provide electrical isolation of the second TDV structure 364 from elements other than the at least one first interconnect structure 130. The first and second dielectric liners 372, 374 include a dielectric material, which can be silicon oxide, silicon nitride, silicon oxynitride, a dielectric metal oxide, a dielectric metal nitride, a dielectric metal oxynitride, or a combination thereof. The first and second dielectric liners 372, 374 can be formed, for example, by a conformal deposition of a dielectric material layer, and by a subsequent anisotropic etch that removes horizontal portions of the deposited dielectric material layer. A remaining vertical portion of the conformal dielectric material layer within the first TDV opening 352 constitutes the first dielectric liner 372, and a remaining vertical portion of the conformal dielectric material layer within the second TDV opening 354 constitutes the second dielectric liner 374. The lateral thickness of the first and second dielectric liners 372, 374 can be in a range from 10 nm to 200 nm, although lesser and greater thicknesses can also be employed.

Figure 6:
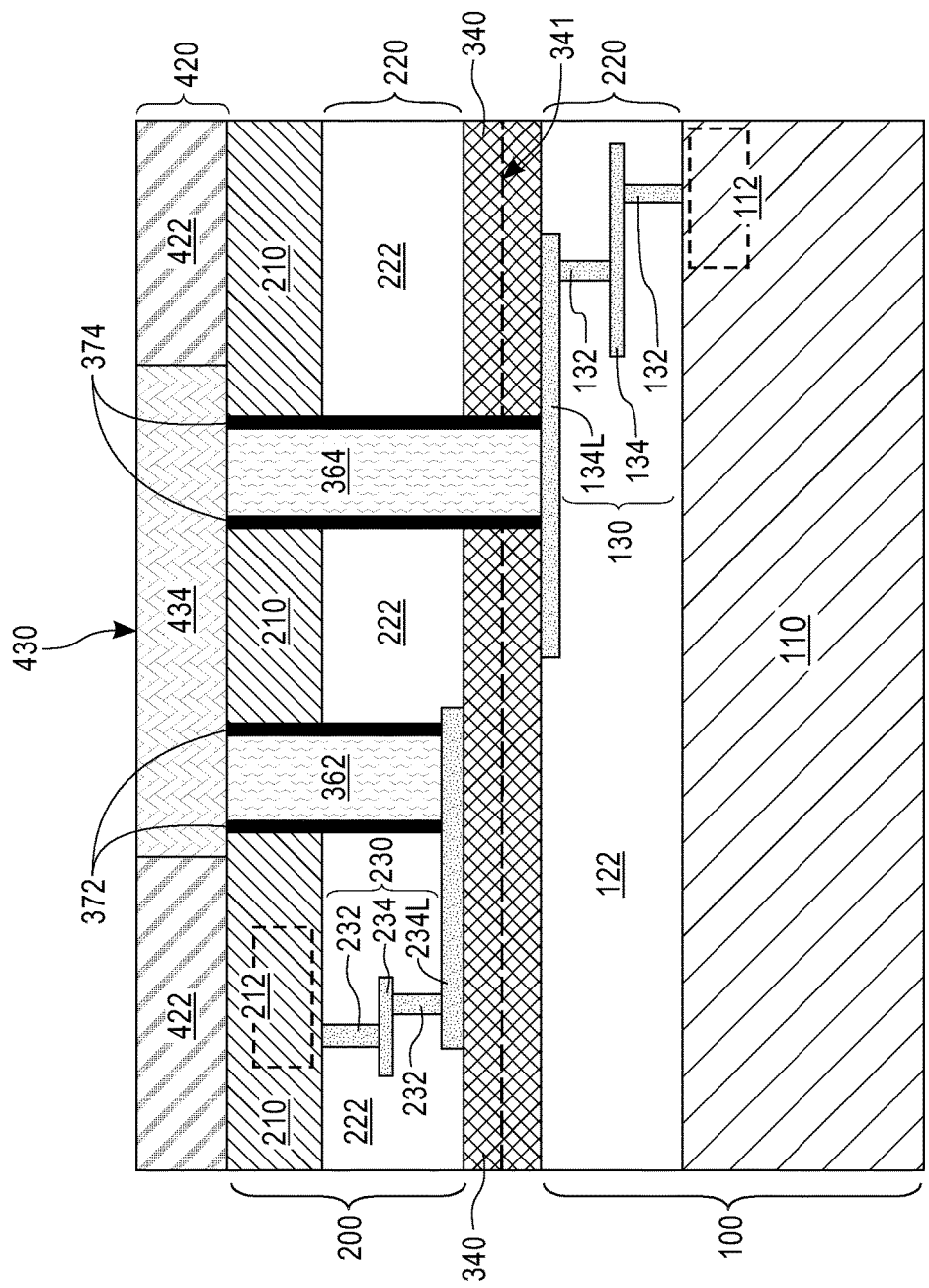
FIG. 6 is a vertical cross-sectional view of the exemplary structure of FIG. 5 after forming a third BEOL wiring structure on the backside of the second semiconductor substrate, contacting the first TDV structure and the second TDV structure.

Referring to FIG. 6, a third BEOL wiring structure 420 is formed on the backside surface of the second semiconductor substrate 210. The third BEOL wiring structure 420 includes at least one third dielectric material layer 422 and at least one third interconnect structure 430 embedded therein. In one embodiment, the at least one third interconnect structure 430 includes a third conductive line structure 434 contacting top surfaces of the first TDV structure 362 and the second TDV structure 364. The third conductive line structure 434 provides electrical connection between the at least one first semiconductor device 112 and the at least one second semiconductor device 212.

As shown, the last level second conductive line structure 234L and the third conductive line structure 434 are electrically connected in parallel by the first TDV structure 362 extended vertically in the second substrate 200. The last level first conductive line structure 134L and the third conductive line structure 434 are electrically connected in parallel by the second TDV structure 364 extended vertically in the second substrate 200. As a result, the last level first and second conductive line structures 134L, 234L, the third conductive line structure 434 and the first and second TDV structures 362, 364 are interconnected in electric continuity to effectively define an integrated inductor.

While the present application has been described in terms of specific embodiments, it is evident in view of the foregoing description that numerous alternatives, modifications and variations will be apparent to those skilled in the art. Each of the various embodiments of the present application can be implemented alone, or in combination with any other embodiments of the present application unless expressly disclosed otherwise or otherwise impossible as would be known to one of ordinary skill in the art. Accordingly, the present application is intended to encompass all such alternatives, modifications and variations which fall within the scope and spirit of the present application and the following claims.

What is claimed is:

1. A method of forming a structure comprising:
   forming a bonded structure comprising a first substrate and a second substrate bonded to each other through a boned material layer, wherein the first substrate comprises a stack of a first semiconductor substrate and a first wiring structure comprising at least one first dielectric material layer and at least one first interconnect structure embedded therein, and the second substrate comprises a second semiconductor substrate and a second wiring structure comprising at least one second dielectric material layer and at least one second interconnect structure embedded therein, the first substrate being bonded to the second substrate such that the at least one first dielectric material layer faces and underlies the at least one second dielectric material layer;
   concurrently forming a first through dielectric via (TDV) opening and a second TDV opening utilizing a single anisotropic etch and an etching gas containing fluorocarbon-containing molecules having a formula $C_xF_yM$, wherein M is chlorine, bromine, sulfur, oxygen or nitrogen, and x is from 2 to 5, and y is from 4 to 10, the first TDV opening extending through the second semiconductor substrate and the at least one second dielectric material layer to expose a last level second conductive line structure in the at least one second interconnect structure, and the second TDV opening extending through the second semiconductor substrate, the at least one second dielectric material layer and the bonded material layer to expose a last level first conductor line structure in the at least one first interconnect structure; and
   forming a first TDV structure within the first TDV opening and a second TDV structure within the second TDV opening.

2. The method of claim 1, wherein the etching gas dissociates during the single anisotropic etch into fluorine-deficient fluorocarbon species.

3. The method of claim 2, wherein the fluorine-deficient fluorocarbon species comprise $CF_2$, CF, $CHF_3$, $C_4F_8$, $C_5HF_7$, or $C_{x'}F_{y'}M$, wherein M is chlorine, bromine, sulfur, oxygen, or nitrogen, and wherein x' is from 1 to 5 and y' is from 1 to 8.

4. The method of claim 1, wherein the second TDV opening extends to a greater depth than the first TDV opening.

5. The method of claim 1, wherein the concurrently forming the first TDV opening and the second TDV opening comprises:
   forming a photoresist layer over a backside surface of the second semiconductor substrate;
   lithographically patterning the photoresist layer; and
   sequentially etching the second semiconductor substrate, the at least one second dielectric material and the bonded material layer by a single anisotropic etch employing remaining portions of the photoresist layer as an etch mask.

6. The method of claim 5, wherein the second semiconductor substrate, the at least one second dielectric material and the bonded material layer are etched at a rate of 15 nm/s.

7. The method of claim 1, wherein the first TDV structure extends through the second substrate and contacts the last level second conductive line structure in the at least one second interconnect structure, and the second TDV structure extends through the second substrate and the bonded material layer and contacts the last level first conductive line structure in the at least one first interconnect structure.

8. The method of claim 1, wherein the forming the first TDV structure in the first TDV opening and the second TDV structure in the second TDV opening comprises:
   depositing a conductive material within the first TDV opening and the second TDV opening and on a backside surface of the second semiconductor substrate; and
   removing excess portions of the conductive material from the backside surface of the second semiconductor structure.

9. The method of claim 8, wherein the depositing the conductive material is performed by physical vapor deposition, chemical vapor deposition, electroplating, electroless plating, or combinations thereof.

10. The method of claim 8, wherein the removing the excess portions of the conductive material is performed by a recess etch, chemical mechanical planarization, or a combination thereof.

11. The method of claim 10, wherein the forming the first dielectric liner and the second dielectric liner comprises:
   forming a dielectric material layer on exposed surfaces of the first TDV opening and the second TDV opening; and
   removing horizontal portions of dielectric material layer.

12. The method of claim 1, further comprising forming a first dielectric liner on sidewalls of the first TDV opening, and a second dielectric liner on sidewalls of the second TDV opening prior to the forming the first TDV structure and the second TDV structure.

13. The method of claim 1, further comprising forming a third wiring structure over a backside surface of the second semiconductor substrate, wherein the third wiring structure comprising at least one third dielectric material layer and at least one third interconnect structure.

14. The method of claim 13, wherein the at least one third interconnect structure comprises a third conductive line structure contacting top surfaces of the first TDV structure and the second TDV structure.

15. The method of claim 1, further forming a first bonding material layer on the first wiring structure.

16. The method of claim 15, further comprising forming a second bonding material layer on the second wiring structure.

17. The method of claim 15, wherein the forming the bonded structure comprises:
   contacting the second substrate to the first substrate, wherein a surface of the first bonding material layer is in direct contact with a surface of the second bonding material layer; and
   introducing an oxide-to-oxide bonding between the first bonding material layer and the second bonding material layer to form a bonded material layer that bonds the first substrate and the second substrate.

18. The method of claim 17, wherein the oxide-to-oxide bonding is effected by an anneal.

19. The method of claim 18, wherein the anneal is performed at a temperature ranging from 200° C. to 500° C.

* * * * *